(12) United States Patent
Kim et al.

(10) Patent No.: US 9,605,814 B2
(45) Date of Patent: Mar. 28, 2017

(54) LIGHTING MODULE

(75) Inventors: Ki Hyun Kim, Seoul (KR); Sung Ho Hong, Seoul (KR); Jae Hun Yoon, Seoul (KR); Seung Beom Jeong, Seoul (KR)

(73) Assignee: LG Innotek Co., Ltd., Seoul (KR)

(*) Notice: Subject to any disclaimer, the term of this patent is extended or adjusted under 35 U.S.C. 154(b) by 0 days.

(21) Appl. No.: 14/342,768

(22) PCT Filed: Sep. 7, 2012

(86) PCT No.: PCT/KR2012/007211
§ 371 (c)(1),
(2), (4) Date: Mar. 4, 2014

(87) PCT Pub. No.: WO2013/036062
PCT Pub. Date: Mar. 14, 2013

(65) Prior Publication Data
US 2014/0211465 A1    Jul. 31, 2014

(30) Foreign Application Priority Data

Sep. 8, 2011  (KR) .................. 10-2011-0090971
Oct. 24, 2011 (KR) .................. 10-2011-0108768
Oct. 24, 2011 (KR) .................. 10-2011-0108770

(51) Int. Cl.
*F21K 99/00*   (2016.01)
*F21V 7/00*    (2006.01)
(Continued)

(52) U.S. Cl.
CPC ............. *F21K 9/50* (2013.01); *F21K 9/60* (2016.08); *F21V 7/005* (2013.01); *F21V 7/0008* (2013.01);
(Continued)

(58) Field of Classification Search
CPC ........ G02F 1/133615; F21K 9/10; F21K 9/17; F21K 9/30; F21K 9/50; F21K 9/54; F21V 7/005; F21V 7/0008; F21Y 2103/003
(Continued)

(56) References Cited

U.S. PATENT DOCUMENTS 1,900,551 A * 3/1933 Guth ......................... 362/348
4,599,684 A * 7/1986 Lee .......................... 362/346
(Continued)

FOREIGN PATENT DOCUMENTS

CN     1610137     4/2005
CN     1855480     11/2006
(Continued)

OTHER PUBLICATIONS

International Search Report dated Feb. 28, 2013 issued in Application No. PCT/KR2012/007211.
(Continued)

*Primary Examiner* — Andrew Coughlin
*Assistant Examiner* — Colin Cattanach
(74) *Attorney, Agent, or Firm* — KED & Associates LLP

(57) ABSTRACT

A lighting module may be provided that comprises: an optical plate; a base frame including a central frame disposed on the optical plate, a first frame coupled to the central frame, and a second frame coupled to the first frame; a side frame coupled between the optical plate and the second frame of the base frame; and a light source including a substrate disposed on the side frame and a light emitter disposed on the substrate, wherein the second frame is disposed on the light source, and wherein the second frame has an inner surface reflecting light from the light source to at least one of the first frame and the central frame.

19 Claims, 10 Drawing Sheets

(51) Int. Cl.
*F21K 9/60* (2016.01)
*H01L 33/50* (2010.01)
*F21Y 101/00* (2016.01)
*F21Y 103/10* (2016.01)
*F21Y 115/10* (2016.01)

(52) U.S. Cl.
CPC ....... *F21Y 2101/00* (2013.01); *F21Y 2103/10* (2016.08); *F21Y 2115/10* (2016.08); *H01L 33/50* (2013.01); *H01L 33/502* (2013.01); *H01L 33/504* (2013.01)

(58) Field of Classification Search
USPC ................. 362/217.05, 240, 249.02, 800
See application file for complete search history.

(56) References Cited

U.S. PATENT DOCUMENTS

| | | | | |
|---|---|---|---|---|
| 5,054,885 | A * | 10/1991 | Melby | F21V 7/00 359/618 |
| 5,285,356 | A * | 2/1994 | Skene et al. | 362/1 |
| 5,365,411 | A * | 11/1994 | Rycroft | G09F 13/14 362/20 |
| 5,709,460 | A * | 1/1998 | Lester | 362/147 |
| 5,998,925 | A * | 12/1999 | Shimizu et al. | 313/503 |
| 7,455,423 | B2 * | 11/2008 | Takenaka | 362/231 |
| 8,258,704 | B2 * | 9/2012 | Brant | B60Q 1/50 315/160 |
| 8,382,324 | B2 * | 2/2013 | Kang | G02B 6/0096 362/225 |
| 8,523,389 | B2 * | 9/2013 | Holten | F21V 7/0008 362/223 |
| 2002/0105807 | A1 * | 8/2002 | Loughrey | 362/278 |
| 2003/0214725 | A1 * | 11/2003 | Akiyama | 359/640 |
| 2005/0082974 | A1 * | 4/2005 | Fukasawa | G03B 27/72 313/512 |
| 2005/0185394 | A1 * | 8/2005 | Sakamoto et al. | 362/133 |
| 2006/0181901 | A1 * | 8/2006 | Sakai | G02B 6/0096 362/613 |
| 2006/0203512 | A1 | 9/2006 | Ko et al. | |
| 2006/0245188 | A1 * | 11/2006 | Takenaka | H01L 25/0753 362/231 |
| 2007/0014126 | A1 * | 1/2007 | Kuo | G02B 6/0018 362/600 |
| 2007/0070623 | A1 * | 3/2007 | Laski | 362/235 |
| 2007/0171626 | A1 * | 7/2007 | Chang | G02F 1/133602 362/97.3 |
| 2007/0171676 | A1 * | 7/2007 | Chang | G02B 6/0046 362/613 |
| 2007/0217193 | A1 * | 9/2007 | Lin et al. | 362/245 |
| 2008/0128735 | A1 * | 6/2008 | Yoo et al. | 257/98 |
| 2008/0180948 | A1 * | 7/2008 | Yoon et al. | 362/230 |
| 2008/0186431 | A1 * | 8/2008 | Imojo et al. | 349/65 |
| 2010/0182782 | A1 * | 7/2010 | Ladewig | F21V 7/0008 362/235 |
| 2011/0164398 | A1 * | 7/2011 | Holten | F21S 4/003 362/84 |
| 2011/0164417 | A1 * | 7/2011 | Huang | 362/235 |
| 2011/0199787 | A1 * | 8/2011 | Kim et al. | 362/612 |
| 2011/0211335 | A1 | 9/2011 | Ko | |
| 2011/0267839 | A1 * | 11/2011 | Kang et al. | 362/609 |
| 2012/0026728 | A1 * | 2/2012 | Lou et al. | 362/217.05 |
| 2012/0056225 | A1 * | 3/2012 | Mitsuishi et al. | 257/98 |
| 2012/0056527 | A1 * | 3/2012 | Mitsuishi | C09K 11/7734 313/503 |
| 2012/0212956 | A1 * | 8/2012 | Chen | F21V 7/005 362/235 |
| 2012/0287626 | A1 * | 11/2012 | Kang | F21V 13/04 362/235 |

FOREIGN PATENT DOCUMENTS

| | | | |
|---|---|---|---|
| EP | 0 936 682 | A1 | 8/1999 |
| EP | 2 202 447 | A1 | 6/2010 |
| JP | 2002-258764 | A | 9/2002 |
| JP | 2005-123484 | | 5/2005 |
| JP | 2006-106212 | A | 4/2006 |
| JP | 2006-310613 | | 11/2006 |
| JP | 2008-300194 | A | 12/2008 |
| JP | 2010-538453 | | 12/2010 |
| JP | 2011-509500 | | 3/2011 |
| KR | 10-2008-0066404 | A | 7/2008 |
| KR | WO2009028861 | A2 * | 3/2009 ............ H01L 33/00 |
| KR | WO 2009/028861 | A2 * | 5/2009 ............ H01L 33/00 |
| KR | 10-2011-0019300 | A | 2/2011 |
| WO | WO 2009/077979 | A1 | 6/2009 |

OTHER PUBLICATIONS

European Search Report issued in Application No. 12830022.5 dated Mar. 9, 2015.
Japanese Office Action dated Aug. 9, 2016 issued in Application No. 2014-529616.

* cited by examiner

LIGHTING MODULE

CROSS-REFERENCE TO RELATED PATENT APPLICATIONS

This application is a U.S. National Stage Application under 35 U.S.C. §371 of PCT Application No. PCT/KR2012/007211, filed on Sep. 7, 2012, which claims priority to Korean Patent Application No. 10-2011-0090971, filed on Sep. 8, 2011, and Korean Patent Application No. 10-2011-0108768, filed on Oct. 24, 2011, and Korean Patent Application No. 10-2011-0108770, filed on Oct. 24, 2011, whose entire disclosures are hereby incorporated by reference.

TECHNICAL FIELD

Embodiments relate to a lighting module.

BACKGROUND ART

In general, an electric bulb or a fluorescent lamp is commonly used as an indoor or outdoor lighting lamp. However, the electric bulb or the fluorescent lamp has a short life span, so that it should be frequently changed. Moreover, a conventional fluorescent lamp is degraded due to elapse of time for its use. As a result, it is often that its illuminance is gradually decreased.

In order to overcome such problems, a lighting apparatus is now being developed by using a light emitting device (hereinafter, referred to as LED). The LED is easy to control and has a rapid response speed, high electro-optic conversion efficiency, a long life span, low power consumption and high luminance. The LED is also used to create emotional lighting.

DISCLOSURE OF INVENTION

Technical Problem

The objective of the present invention is to provide a lighting module which does not use a light guide plate.

The objective of the present invention is to provide a lighting module capable of controlling light distribution.

The objective of the present invention is to provide a lighting module of which the lamp apparatus efficiency is higher than 80% and the height (thickness) is less than 20 mm.

The objective of the present invention is to provide a lighting module including a light source which has a high color rendering property.

The objective of the present invention is to provide a lighting module including a light source which has high color reproductivity and excellent color uniformity.

Solution to Problem

One embodiment is a lighting module. The lighting module comprises: an optical plate; a base frame including a central frame disposed on the optical plate, a first frame coupled to the central frame, and a second frame coupled to the first frame; a side frame coupled between the optical plate and the second frame of the base frame; and a light source including a substrate disposed on the side frame and a light emitter disposed on the substrate. The second frame is disposed on the light source. The second frame has an inner surface reflecting light from the light source to at least one of the first frame and the central frame.

The cross sectional shape of the inner surface of the second frame is at least one of a parabolic shape, a hyperbolic shape and an elliptical shape.

The thickness of the central frame is larger than that of the first frame.

The thickness of the first frame becomes larger toward the central frame from the second frame.

The thickness of the central frame becomes larger toward the center of the central frame from one side of the central frame.

The inner surface of the first frame becomes closer to the optical plate toward the central frame from the second frame.

The inner surface of the central frame becomes closer to the optical plate toward the center of the central frame from one side of the central frame.

The side frame comprises a coupler which is coupled to one side of the optical plate.

The light emitter of the light source comprises: a first light emitter disposed on the substrate; and a second light emitter disposed on the substrate and around the first light emitter. The first light emitter comprises a red LED chip, a green LED chip and a first blue LED chip. The second light emitter comprises a second blue LED chip having a wavelength of from 470 nm to 490 nm; and a yellow fluorescent material disposed around the second blue LED chip.

The second light emitter comprises: a first fluorescent material film which is disposed on the second blue LED chip and comprises the yellow fluorescent material; a resin packer which is disposed on the first fluorescent material film; and a second fluorescent material film which is disposed on the resin packer and comprises the yellow fluorescent material.

The first light emitter further comprises a first body in which the red LED chip, the green LED chip and the first blue LED chip are disposed. The second light emitter further comprises a second body in which the second blue LED chip and the yellow fluorescent material are disposed.

The light emitter of the light source comprises: a first light emitter disposed on the substrate; and a second light emitter disposed on the substrate and around the first light emitter. The first light emitter comprises a red LED chip, a green LED chip and a first blue LED chip. The second light emitter comprises a second blue LED chip having a wavelength of from 470 nm to 490 nm; and at least one of a red fluorescent material and a green fluorescent material which are disposed around the second blue LED chip.

The second light emitter comprises: a first fluorescent material film which is disposed on the second blue LED chip and comprises any one of the red fluorescent material and the green fluorescent material; a resin packer which is disposed on the first fluorescent material film; and a second fluorescent material film which is disposed on the resin packer and comprises any one of the red fluorescent material and the green fluorescent material.

The first light emitter further comprises a first body in which the red LED chip, the green LED chip and the first blue LED chip are disposed. The second light emitter further comprises a second body in which the second blue LED chip and any one of the red fluorescent material and the green fluorescent material are disposed.

Another embodiment is a lighting module. The lighting module comprises: an optical plate; a base frame including a central frame disposed on the optical plate, a first frame coupled to the central frame, and a second frame coupled to the first frame; a side frame coupled between the optical plate and the second frame of the base frame; and a light source including a substrate disposed on the side frame in such a manner as to be perpendicular to the optical plate, and a light emitter disposed on the substrate.

The side frame comprises: a first side frame on which the substrate of the light source is disposed and which is coupled to the second frame of the base frame; and a second side frame which is coupled to the first side frame and is coupled to optical plate.

The second frame of the base frame has a recess receiving one side of the substrate of the light source. The second side frame of the side frame has a recess receiving the other side of the substrate of the light source.

The second side frame of the side frame comprises a coupler which is coupled to a portion of the optical plate.

The thickness of the first frame of the base frame is uniform. The thickness of the central frame is larger than that of the first frame. The inner surface of the first frame comprises a predetermined roughness.

The cross sectional shape of the central frame of the base frame is a hemisphere or a semi-ellipse.

Advantageous Effects of Invention

A lighting module according to the embodiment does not use a light guide plate, thereby causing the lighting module to be lighter and to have a low unit cost.

A lighting module according to the embodiment is capable of controlling light distribution.

A lighting module according to the embodiment has a lamp apparatus efficiency higher than 80% and height (thickness) less than 20 mm A lighting module according to the embodiment is capable of providing white light having a high color rendering property by creating a full spectrum based on wavelengths.

A lighting module according to the embodiment is capable of providing high color reproductivity and excellent color uniformity.

MODE FOR THE INVENTION

A thickness or size of each layer is magnified, omitted or schematically shown for the purpose of convenience and clearness of description. The size of each component does not necessarily mean its actual size.

In description of embodiments of the present invention, when it is mentioned that an element is formed "on" or "under" another element, it means that the mention includes a case where two elements are formed directly contacting with each other or are formed such that at least one separate element is interposed between the two elements. The "on" and "under" will be described to include the upward and downward directions based on one element.

Hereafter, a lighting module according to an embodiment will be described with reference to the accompanying drawings.

First Embodiment

Figure 1:
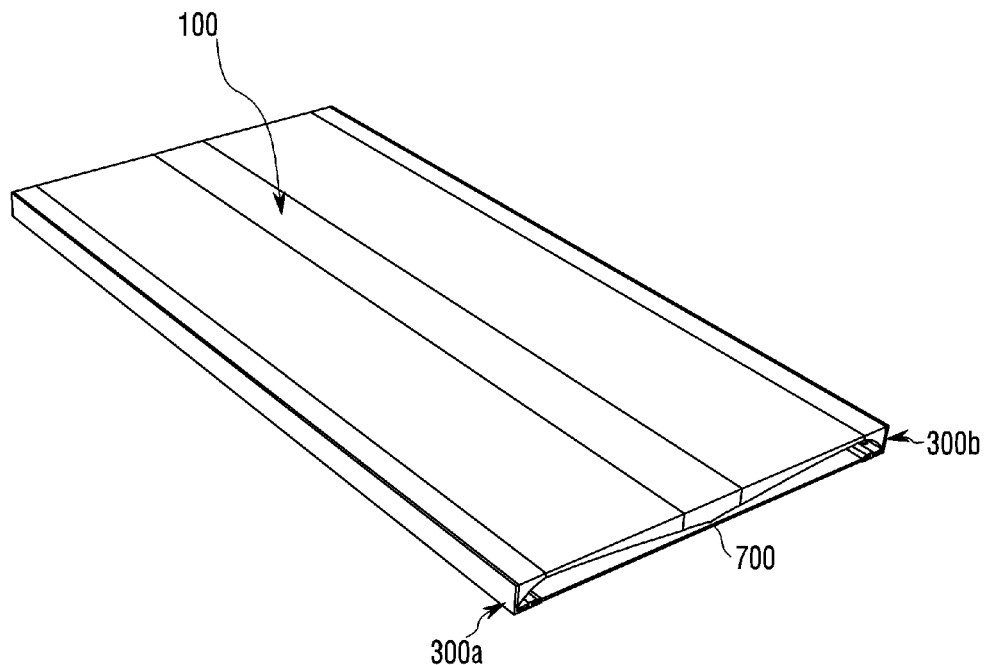
FIG. 1 is a top perspective view of a lighting module according to a first embodiment.
Figure 2:
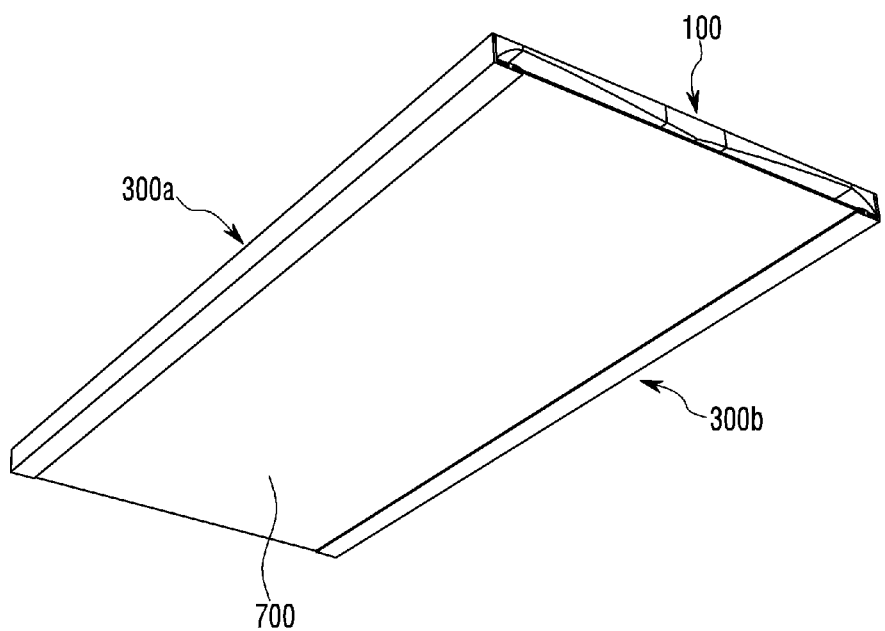
FIG. 2 is a bottom perspective view of the lighting module shown in FIG. 1.
Figure 3:
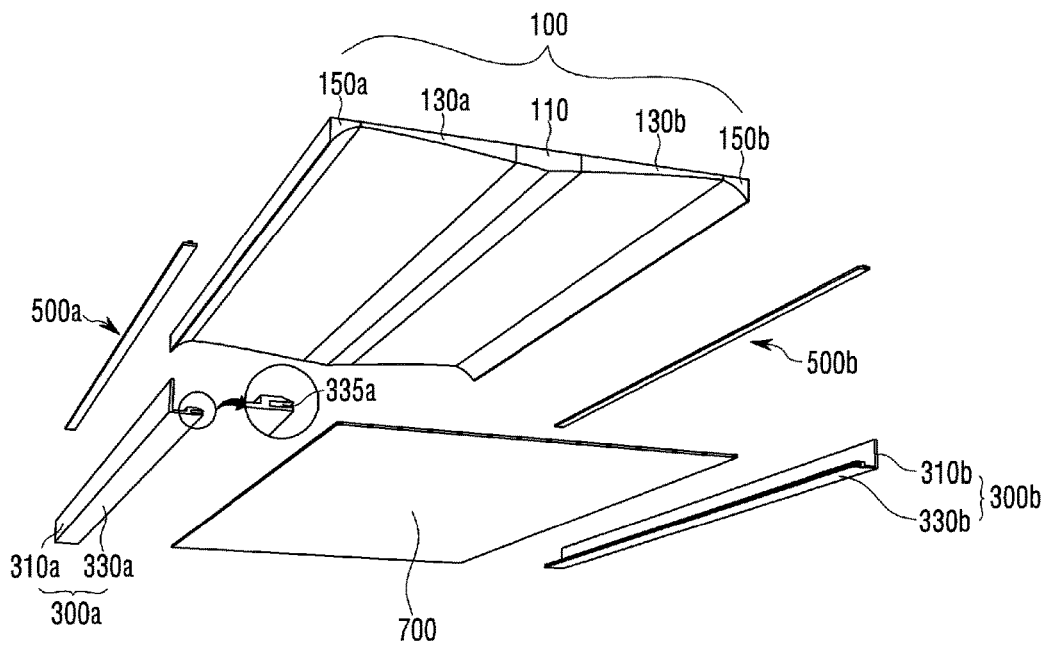
FIG. 3 is an exploded perspective view of the lighting module shown in FIG. 2.
Figure 4:
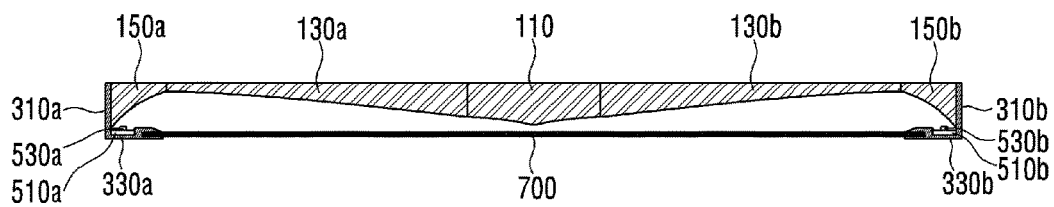
FIG. 4 is a cross sectional view of the lighting module shown in FIG. 1.

FIG. 1 is a top perspective view of a lighting module according to a first embodiment. FIG. 2 is a bottom perspective view of the lighting module shown in FIG. 1. FIG. 3 is an exploded perspective view of the lighting module shown in FIG. 2. FIG. 4 is a cross sectional view of the lighting module shown in FIG. 1.

Referring to FIGS. 1 to 4, the lighting module according to the first embodiment may comprise a base frame 100, side frames 300a and 300b, light sources 500a and 500b, and an optical plate 700.

The base frame 100 may have a plate shape having an outer surface and an inner surface. The outer surface of the base frame 100 forms the appearance of the lighting module according to the embodiment. The inner surface of the base frame 100 is disposed within the lighting module according to the embodiment and reflects light from the light sources 500a and 500b to the optical plate 700.

The base frame 100 may comprise a plurality of frames. Specifically, the base frame 100 may comprise a central frame 110, first frames 130a and 130b, and second frames 150a and 150b.

The central frame 110 is disposed at the center of the base frame 100. The central frame 110 reflects the light from the light sources 500a and 500b to the optical plate 700. For this purpose, an inner surface of the central frame 110 may project outwardly or may be convex. The inner surface of the central frame 110 becomes closer to the optical plate 700 toward the center of the central frame 110 from both sides of the central frame 110. Also, the central frame 110 becomes thicker toward the center of the central frame 110 from both sides of the central frame 110.

The first frames 130a and 130b comprise a first side first frame 130a and a second side first frame 130b. One side of the first side first frame 130a is coupled to one side of both sides of the central frame 110. One side of the second side first frame 130b is coupled to the other side of both sides of the central frame 110. Here, the first frames 130a and 130b and the central frame 110 may be integrally formed with each other.

The first side first frame 130a may become thicker toward the central frame 110 from the second frame 150a. Contrarily, the first side first frame 130a may become thinner toward the second frame 150a from the central frame 110. Also, an inner surface of the first side first frame 130a becomes closer to the optical plate 700 toward the central frame 110 from the second frame 150a. Contrarily, the inner surface of the first side first frame 130a becomes farther from the optical plate 700 toward the second frame 150a from the central frame 110.

The central frame 110 is thicker than the first frame 130a. Also, a distance from the inner surface of the central frame 110 to the optical plate 700 is less than a distance from the inner surface of the first frame 130a to the optical plate 700.

The inner surface of the first side first frame 130a may reflect light, which is directly or indirectly incident from the first light source 500a, to the central frame 110 and the optical plate 700. An inner surface of the second side first frame 130b may reflect light, which is directly or indirectly incident from the second light source 500b, to the central frame 110 and the optical plate 700.

The second frames 150a and 150b comprise a first side second frame 150a and a second side second frame 150b. The first side second frame 150a is coupled to the other side of the first side first frame 130a. The second side second frame 150b is coupled to the other side of the second side first frame 130b. Here, the second frames 150a and 150b may be integrally formed with the first frames 130a and 130b or may be integrally formed with the first frames 130a and 130b and the central frame 110.

An inner surface of the first side second frame 150a reflects the light from the first light source 500a to the first side first frame 130a, the central frame 110 and the optical plate 700. An inner surface of the second side second frame 150b reflects the light from the second light source 500b to the second side first frame 130b, the central frame 110 and the optical plate 700.

The inner surfaces of the second frames 150a and 150b may have various shapes. Specifically, the inner surfaces of the second frames 150a and 150b may have any one of a parabolic shape, a hyperbolic shape and an elliptical shape. This will be described with reference to FIGS. 5 to 7.

Figure 5:
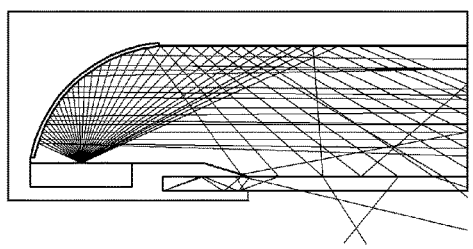
FIG. 5 is a view for describing a traveling path of light when an inner surface of a second frame shown in FIG. 4 has a parabolic shape.

FIG. 5 is a view for describing a traveling path of light when an inner surface of a second frame shown in FIG. 4 has a parabolic shape.

Referring to FIGS. 4 and 5, the inner surfaces of the second frames 150a and 150b have a parabolic shape. When light emitting devices 530a and 530b are located at the focus of the parabola, the inner surfaces of the second frames 150a and 150b reflect the light incident from the light emitting devices 530a and 530b in parallel with the optical plate 700. Therefore, the light reflected by the inner surfaces of the second frames 150a and 150b may be incident on the inner surfaces of the first frames 130a and 130b and the central frame 110. The second frames 150a and 150b having the parabolic inner surface have an advantage to collect a large amount of the light to the inner surface of the central frame 110.

Figure 6:
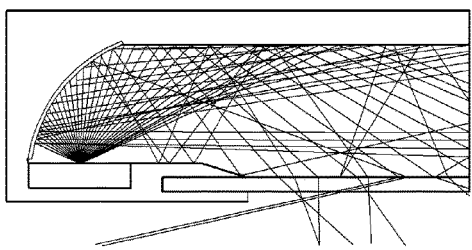
FIG. 6 is a view for describing a traveling path of light when the inner surface of a second frame shown in FIG. 4 has a hyperbolic shape.

FIG. 6 is a view for describing a traveling path of light when the inner surface of a second frame shown in FIG. 4 has a hyperbolic shape.

Referring to FIGS. 4 and 6, the inner surfaces of the second frames 150a and 150b have a hyperbolic shape. When the light emitting devices 530a and 530b are located at the focus of the hyperbola, the inner surfaces of the second frames 150a and 150b diffuse the light incident from the light emitting devices 530a and 530b. Therefore, the light reflected by the inner surfaces of the second frames 150a and 150b may be incident more on the inner surfaces of the first frames 130a and 130b, particularly, on the first frames 130a and 130b adjacent to the second frames 150a and 150b.

Figure 7:
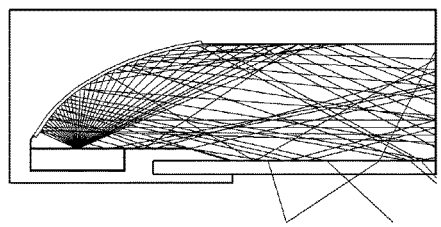
FIG. 7 is a view for describing a traveling path of light when the inner surface of a second frame shown in FIG. 4 has an elliptical shape.

FIG. 7 is a view for describing a traveling path of light when the inner surface of a second frame shown in FIG. 4 has an elliptical shape.

Referring to FIGS. 4 and 7, the inner surfaces of the second frames 150a and 150b have an elliptical shape. When the light emitting devices 530a and 530b are located at any one focus of the ellipse, the inner surfaces of the second frames 150a and 150b collect the light incident from the light emitting devices 530a and 530b to the other focus of the ellipse. Therefore, most of the light reflected by the inner surfaces of the second frames 150a and 150b may be incident on the inner surfaces of the first frames 130a and 130b, particularly, on the central frame 110.

Referring back to FIGS. 1 to 4, the side frames 300a and 300b are disposed on both side of the central base 110 respectively. The side frames 300a and 300b may comprise a first side frame 300a and a second side frame 300b. The first side frame 300a may be coupled to the first side second frame 150a of the base frame 100. The second side frame 300b may be coupled to the second side second frame 150b of the base frame 100.

The first side frame 300a and the second side frame 300b support both sides of the base frame 100 and both sides of the optical plate 700, so that the base frame 100 and the optical plate 700 can be spaced apart from each other.

The first side frame 300a and the second side frame 300b receive the first light source 500a and the second light source 500b. Specifically, the first side frame 300a receives the first light source 500a. The second side frame 300b receives the second light source 500b.

The first side frame 300a is coupled to the first side second frame 150a of the base frame 100 and is coupled to one side of the optical plate 700. The second side frame 300b is coupled to the second side second frame 150b of the base frame 100 and is coupled to the other side of the optical plate 700. The first side frame 300a may comprise a first_A side frame 310a and a second_A side frame 330a. The first_A side frame 310a is coupled to the base frame 100. The second_A side frame 330a is coupled to one side of the optical plate 700.

The first_A side frame 310a and the second_A side frame 330a may have a plate shape respectively and may form a predetermined angle. The first_A side frame 310a and the second_A side frame 330a may be formed in correspondence with the shapes of the second frames 150a and 150b. Specifically, the first_A side frame 310a and the second_A side frame 330a may be substantially perpendicular to each other. Here, the first_A side frame 310a and the second_A side frame 330a may be integrally formed with each other and they can be distinguished as the first_A side frame 310a and the second_A side frame 330a by bending the first side frame 300a.

An inner surface of the first_A side frame 310a may come in surface contact with and may be coupled to an outer surface of the first side second frame 150a of the base frame 100. Through the surface contact, heat radiated from the first light source 500a can be transferred to the base frame 100.

The second_A side frame 330a is coupled to one side of the optical plate 700. Specifically, the second_A side frame 330a may have a structure capable of receiving the one side of the optical plate 700. For example, the second_A side frame 330a may have a coupler 335a allowing the second_A side frame 330a to be coupled to the one side of the optical plate 700. Thanks to the coupler 335a, the optical plate 700 can be coupled to the second_A side frame 330a in a sliding manner.

The first light source 500a is disposed in the second_A side frame 330a. The first light source 500a disposed in the second_A side frame 330a emits light toward the base frame 100. The second_A side frame 330a may be disposed in parallel with the optical plate 700. When the second_A side frame 330a is disposed in parallel with the optical plate 700, the position of the first light source 500a may be specified.

Since the structure of the second side frame 300b is the same as that of the above-described first side frame 300a, a detailed description thereof will be replaced by the foregoing description.

The first side frame 300a and the second side frame 300b may be formed of a material capable of easily radiating the heat from the first light source 500a and the second light source 500b. For example, the first side frame 300a and the second side frame 300b may be formed of Al, an alloy including Al, and the like. Here, the base frame 100 may be also formed of the same heat radiating material as those of the first side frame 300a and the second side frame 300b. However, there is no limit to this. The base frame 100 may be formed of a material different from those of the first side frame 300a and the second side frame 300b.

The light sources 500a and 500b may comprise the first light source 500a disposed in the first side frame 300a, and the second light source 500b disposed in the second side frame 300b. Here, since the second light source 500b is the same as the first light source 500a, a description of the second light source 500b will be replaced by the following description of the first light source 500a.

The first light source 500a may comprise a substrate 510a and the light emitting device 530a.

A plurality of the light emitting devices 530a may be disposed on one side of the substrate 510a in a row or may be disposed adjacent to each other. The other side of the substrate 510a is disposed in the second_A side frame 330a of the first side frame 300a.

The substrate 510a and the optical plate 700 may be disposed on the same plane with each other. Otherwise, the substrate 510a may be disposed in parallel with the optical plate 700. Also, the substrate 510a may be disposed in parallel with the outer surface of the base frame 100.

The substrate 510a may comprise a printed circuit board (PCB), a metal core PCB (MCPCB), a flexible PCB (FPCB), a ceramic substrate or the like.

The light emitting device 530a may be a light emitting diode (LED). A position on which the light emitting device 530a is disposed on the substrate 510a may be changed according to the cross sectional shapes of the second frames 150a and 150b of the base frame 100. That is, when the cross sectional shapes of the second frames 150a and 150b are a parabolic shape, a hyperbolic shape and an elliptical shape, the light emitting device 530a may be disposed at a position corresponding to the foci of the parabola, hyperbola and ellipse. However, there is no limit to this. The light emitting device 530a may not be disposed at the position corresponding to the foci of the parabola, hyperbola and ellipse.

The plurality of the light emitting devices 530a may emit the same colored light or differently colored lights.

The light emitting device 530a may be a blue light emitting device or a white light emitting device having a high color rendering index (CRI). Synthetic resin including a fluorescent material is molded on a blue light emitting chip, so that the white light emitting device emits white light. Here, the fluorescent material may comprise at least any one selected from a group consisting of a garnet material (YAG, TAG), a silicate material, a nitride material and an oxynitride material. Though natural light (white light) can be created by allowing the synthetic resin to comprise only yellow fluorescent material, the synthetic resin may further comprise a green fluorescent material or a red fluorescent material in order to improve a color rendering index and to reduce a color temperature. When the synthetic resin is mixed with many kinds of fluorescent materials, an addition ratio of the color of the fluorescent material may be formed such that the green fluorescent material is more used than the red fluorescent material, and the yellow fluorescent material is more used than the green fluorescent material. The garnet material, the silicate material and the oxynitride material may be used as the yellow fluorescent material. The silicate material and the oxynitride material may be used as the green fluorescent material. The nitride material may be used as the red fluorescent material. The synthetic resin may be mixed with various kinds of the fluorescent materials or may be configured by a layer including the red fluorescent material, a layer including the green fluorescent material and a layer including the yellow fluorescent material, which are formed separately from each other.

The first light source 500a may further comprise a heat radiation sheet (not shown). The heat radiation sheet (not shown) may be disposed between the substrate 510a and the first side frame 300a. The heat radiation sheet (not shown) may rapidly transfer the heat from the substrate 510a to the first side frame 300a.

The light emitting devices 530a of the first light source 500a may have a color temperature different from that of the light emitting devices 530b of the second light source 500b. For example, a plurality of the light emitting devices 530a comprised in the first light source 500a may be a warm white LED, and a plurality of the light emitting devices 530b comprised in the second light source 500b may be a cool white LED. The warm white LED and the cool white LED emit white light. Since the warm white LED and the cool white LED are able to emit mixed white light by emitting a correlated color temperature respectively, a color rendering index (CRI) representing how close light is to natural sunlight becomes larger. Accordingly, it is possible to prevent an actual color of an object from being distorted and to reduce fatigue of the eyes of a user.

The optical plate 700 transmits the light which has been emitted from the light sources 500a and 500b and has been reflected by the inner surface of the base frame 100.

The optical plate 700 may have a plate shape having an outer surface and an inner surface. The one side of the optical plate 700 may be coupled to the first side frame 300a. The other side of the optical plate 700 may be coupled to the second side frame 300b.

The optical plate 700 may allow the light incident from the base frame 100 to pass therethrough as it is. Otherwise, the optical plate 700 may diffuse the light incident from the base frame 100. For this purpose, the optical plate 700 may comprise a diffusion material.

The optical plate 700 may have a predetermined pattern for the purpose of more improving light diffusion rate. The pattern may have a concave lens shape or a convex lens shape.

The optical plate 700 may be transparent, opaque or translucent.

The optical plate 700 may emit light which is excited by the incident light and has a wavelength different from that of the incident light. For this, the optical plate 700 may have a fluorescent material. The fluorescent material may comprise at least any one of a yellow fluorescent material, a green fluorescent material and a red fluorescent material.

Figure 8:
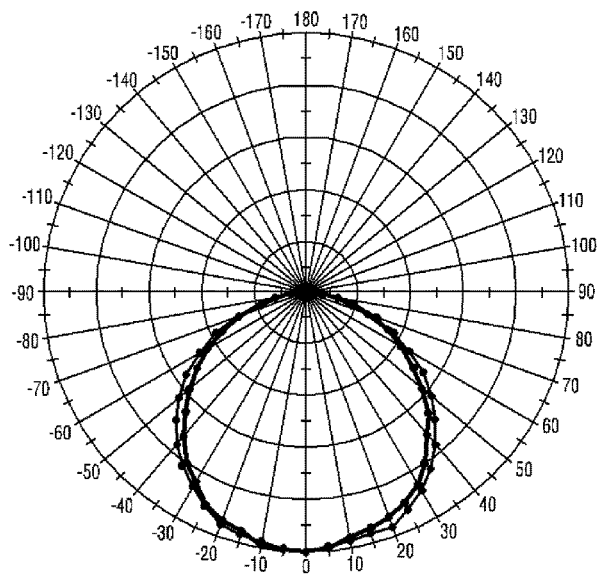
FIG. 8 is a graph showing an optical characteristic of the lighting module shown in FIGS. 1 to 4.
Figure 9:
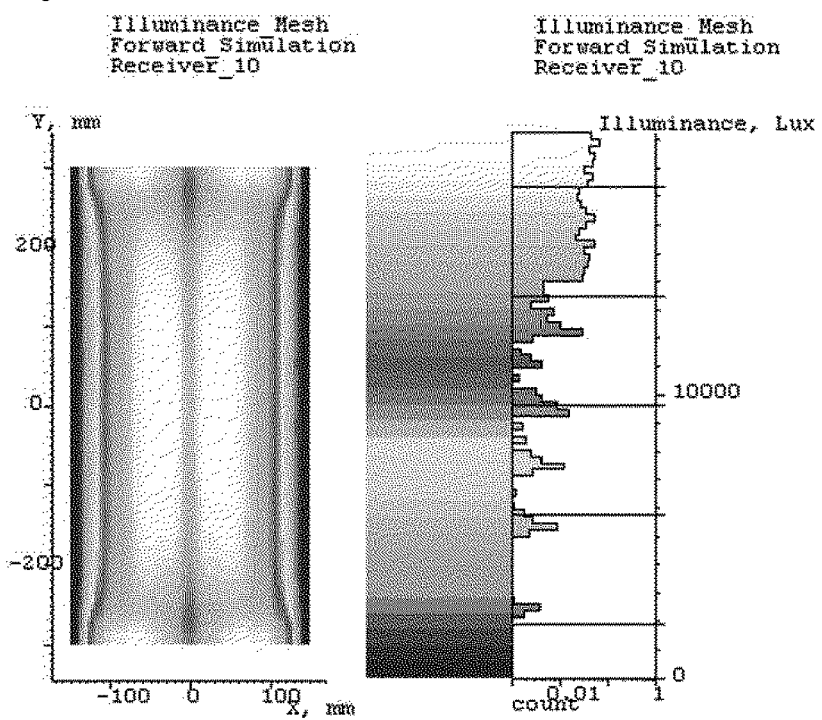
FIG. 9 is a view showing a luminous flux distribution of the lighting module shown in FIGS. 1 to 4.

FIG. 8 is a graph showing an optical characteristic of the lighting module according to the first embodiment shown in FIGS. 1 to 4. FIG. 9 is a view showing a luminous flux distribution of the lighting module according to the first embodiment shown in FIGS. 1 to 4.

Referring to FIGS. 8 and 9, it can be seen that uniformity, efficiency and a beam angle of the light emitted from the lighting module according to the first embodiment are about 83.3%, about 87.2% and about 110° respectively.

Meanwhile, through the described configuration, a size of the lighting module according to the first embodiment shown in FIGS. 1 to 4 may be reduced. Specifically, the size and height of the lighting module according to the first embodiment may be within 300×600 (mm) and 20 mm respectively.

Second Embodiment

Figure 10:
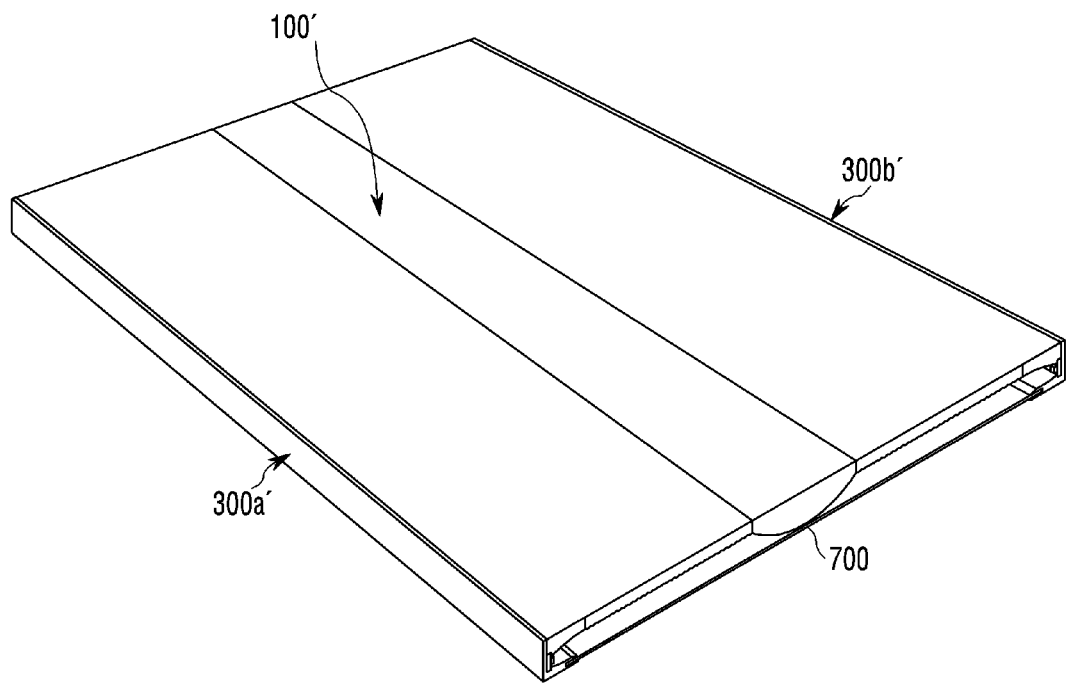
FIG. 10 is a top perspective view of a lighting module according to a second embodiment.
Figure 11:
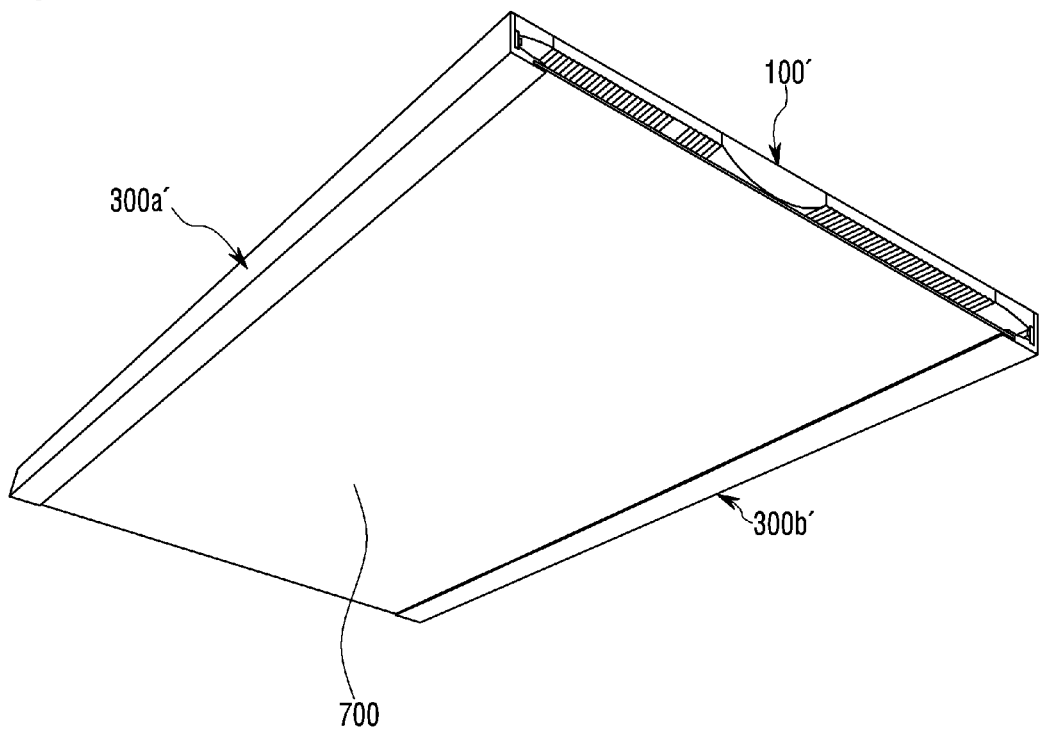
FIG. 11 is a bottom perspective view of the lighting module shown in FIG. 10.
Figure 12:
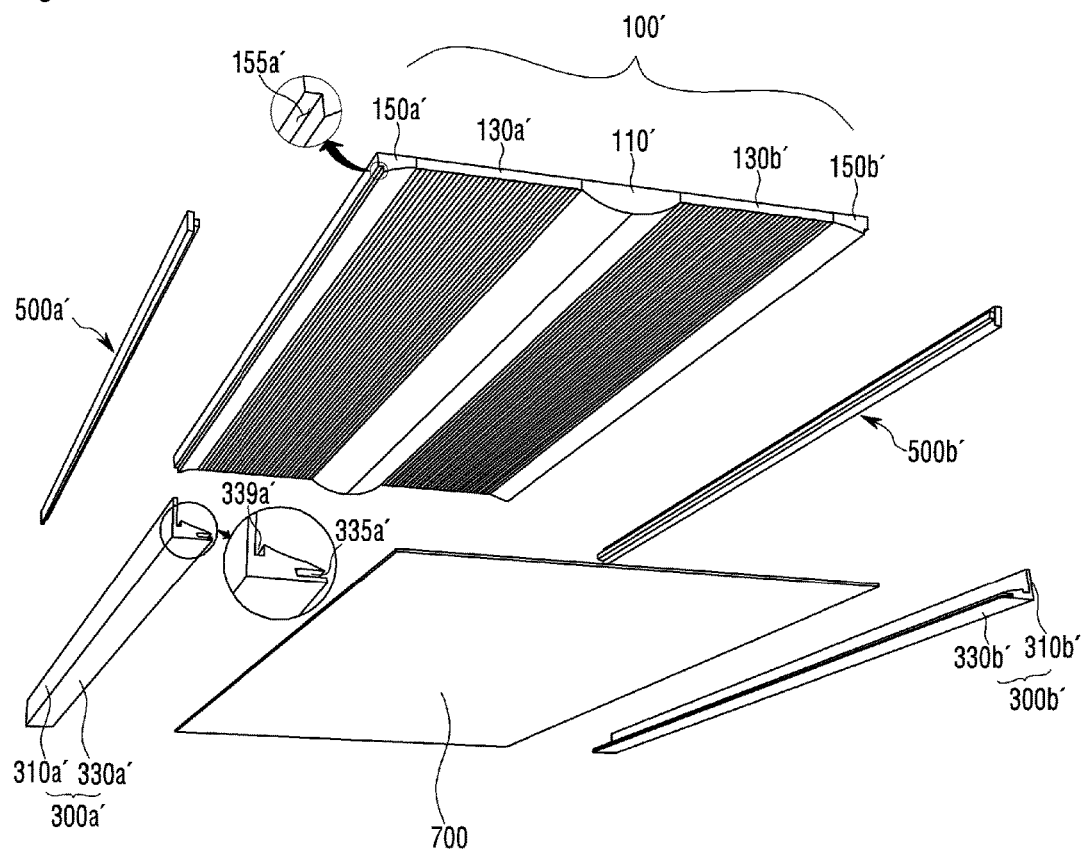
FIG. 12 is an exploded perspective view of the lighting module shown in FIG. 11.
Figure 13:
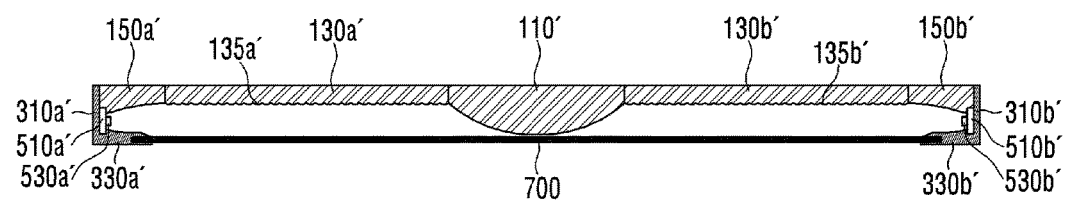
FIG. 13 is a cross sectional view of the lighting module shown in FIG. 10.

FIG. 10 is a top perspective view of a lighting module according to a second embodiment. FIG. 11 is a bottom perspective view of the lighting module shown in FIG. 10. FIG. 12 is an exploded perspective view of the lighting module shown in FIG. 11. FIG. 13 is a cross sectional view of the lighting module shown in FIG. 10.

Referring to FIGS. 10 to 13, the lighting module according to the second embodiment comprises a base frame 100', side frame 300a' and 300b', light sources 500a' and 500b', and an optical plate 700. Here, since the optical plate 700 is the same as the optical plate 700 shown in FIGS. 1 to 4, a detailed description thereof will be omitted.

Hereafter, regarding the base frame 100', the side frames 300a' and 300b', and the light sources 500a' and 500b', descriptions of the same parts as those of the base frame 100, the side frames 300a and 300b, the light sources 500a and 500b shown in FIGS. 1 to 4 will be omitted, and different parts will be described below in detail.

The base frame 100' may comprise a central frame 110', first frames 130a' and 130b', and second frames 150a' and 150b'.

A cross section of the central frame 110' may have a hemispherical shape. In this specification, the hemispherical shape includes not only a geometrically perfect hemispherical shape but also a semi-elliptical shape.

The first frames 130a' and 130b' comprise a first side first frame 130a' and a second side first frame 130b'.

Unlike the first frames 130a and 130b shown in FIGS. 1 to 4, the first frames 130a' and 130b' may have a uniform thickness.

Inner surfaces of the first frames 130a' and 130b' may have predetermined roughnesses 135a' and 135b'. The cross sectional shapes of the roughnesses 135a' and 135b' may be various, for example, a hemisphere, a semi-ellipse, a polygon or the like. Due to the roughnesses 135a' and 135b', light from the light sources 500a' and 500b' can be reflected toward the optical plate 700.

The minimum thickness of the central frame 110' is larger than the thickness of the first frame 130a'. Here, the minimum thickness of the central frame 110' may be the same as or larger than the thickness of the first frame 130a'. A distance from an inner surface of the central frame 110' to the optical plate 700 is less than a distance from the inner surface of the first frame 130a' to the optical plate 700. Here, a distance from the thickest portion of the central frame 110' to the optical plate 700 may be less than the distance from the first frame 130a' to the optical plate 700.

The second frames 150a' and 150b' comprise a first side second frame 150a' and a second side second frame 150b'. The first side second frame 150a' is coupled to the other side of the first side first frame 130a'. The second side second frame 150b' is coupled to the other side of the second side first frame 130b'. Here, the second frames 150a' and 150b' may be integrally formed with the first frames 130a' and 130b' or may be integrally formed with the first frames 130a' and 130b' and the central frame 110'.

An inner surface of the first side second frame 150a' may reflect the light from the first light source 500a' to the first side first frame 130a', the central frame 110' and the optical plate 700. An inner surface of the second side second frame 150b' may reflect the light from the second light source 500b' to the second side first frame 130b', the central frame 110' and the optical plate 700. For this, the second frames 150a' and 150b' may have predetermined curved inner surfaces. The curved surface may have a curvature corresponding to an inner surface of a second_A side frame 330a'.

The second frames 150a' and 150b' may have a recess 155a'. One sides of the light sources 500a' and 500b' may be disposed in the recess 155a'. The light sources 500a' and 500b' can be fixed by the recess 155a'.

Specifically, the recess 155a' and a recess 339a' of a first side frame 300a' receive both sides of substrates 510a' and 510b' of the light sources 500a' and 500b'. Here, the substrates 510a' and 510b' may be coupled in a sliding manner via the recesses 155a' of the second frames 150a' and 150b' and via the recess 339a' of the first side frame 300a'. Here, the coupling method of the substrates 510a' and 510b' is not limited to the sliding manner.

The side frames 300a' and 300b' may comprise the first side frame 300a' and a second side frame 300b'.

The first side frame 300a' may comprise a first_A side frame 310a' and a second_A side frame 330a'. The first_A side frame 310a' is coupled to the base frame 100'. The second_A side frame 330a' is coupled to one side of the optical plate 700.

The first_A side frame 310a' may have a plate shape. The first_A side frame 310a' and the second_A side frame 330a' may be substantially perpendicular to each other. Here, an angle between the first_A side frame 310a' and the second_A side frame 330a' may be changed according to the shapes of the second frames 150a' and 150b'. The first_A side frame 310a' and the second_A side frame 330a' may be integrally formed with each other and they can be distinguished as the first_A side frame 310a' and the second_A side frame 330a' by bending the first side frame 300a'.

The first light source 500a' may be disposed on an inner surface of the first_A side frame 310a'. Specifically, the substrate 510a' of the light source 500a' is disposed on the inner surface of the first_A side frame 310a'. Therefore, the light of the light source 500a' is emitted upward from the inner surface of the first_A side frame 310a'.

The inner surface of the first_A side frame 310a' may come in surface contact with and may be coupled to an outer surface of the first side second frame 150a' of the base frame 100'. Through this connection, heat from the first_A side frame 310a' can be transferred to the base frame 100'.

The second_A side frame 330a' is coupled to one side of the optical plate 700. Specifically, the second_A side frame 330a' may have a structure capable of receiving the one side of the optical plate 700. For example, the second_A side frame 330a' may have a coupler 335a' allowing the second_A side frame 330a to be coupled to the one side of the optical plate 700. Thanks to the coupler 335a', the optical plate 700 can be coupled to the second_A side frame 330a' in a sliding manner. Here, the coupling method of the optical plate 700 is not limited to the sliding manner.

A portion of the inner surface of the second_A side frame 330a' may be curved. The curved surface of the second_A side frame 330a' may have a shape corresponding to the curved surface of the second frame 150a of the base frame 100.

The second_A side frame 330a' may have the recess 339a' for fixing the first light source 500a'. The recess 339a' receives one side of the substrate 510a' of the first light source 500a'. Here, the substrate 510a' may be coupled to the recess 339a' of the first side frame 300a' in a sliding manner. Here, the coupling method of the substrates 510a' is not limited to the sliding manner.

Since the structure of the second side frame 300b' is the same as that of the described first side frame 300a', a detailed description thereof will be replaced by the foregoing description.

The light sources 500a' and 500b' may comprise the first light source 500a' disposed in the first side frame 300a' and the second light source 500b' disposed in the second side frame 300b'.

The first light source 500a' and the second light source 500b' may be disposed corresponding to each other or disposed opposite to each other. Specifically, a light emitting device 530a' of the first light source 500a' and a light emitting device 530b' of the second light source 500b' may be disposed corresponding to each other or disposed opposite to each other.

The central frame 110' of the base frame 100' may be disposed between the first light source 500a' and the second light source 500b'. Therefore, when the central frame 110' has the maximum thickness, the light emitted from the first light source 500a' has no effect on the second light source 500b', and the light emitted from the second light source 500b' has no effect on the first light source 500a'.

Since the second light source 500b' is the same as the first light source 500a', a description of the second light source 500b' will be replaced by the following description of the first light source 500a'.

The first light source 500a' may comprise the substrate 510a' and the light emitting device 530a'.

A plurality of the light emitting devices 530a' may be disposed on one side of the substrate 510a' in a row. The other side of the substrate 510a' is disposed on the inner surface of the first_A side frame 310a' of the first side frame 300a'.

One side of the substrate 510a' may be received in the recess 339a' of the second_A side frame 330a' of the first side frame 300a'. The other side of the substrate 510a' may be received in the recess 155a' of the second frame 150a' of the base frame 100'. Accordingly, the substrate 510a' may be coupled to the first side frame 300a' in a sliding manner. Here, the coupling method of the substrate 510a' is not limited to the sliding manner.

Figure 14:
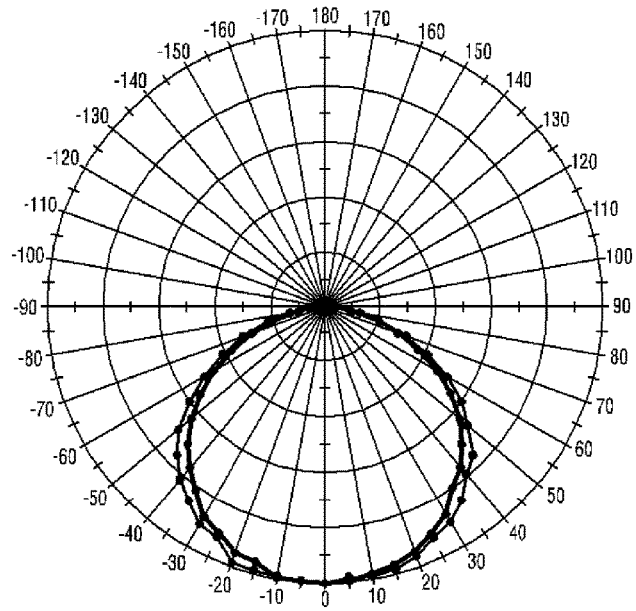
FIG. 14 is a graph showing an optical characteristic of the lighting module shown in FIGS. 10 to 13.
Figure 15:
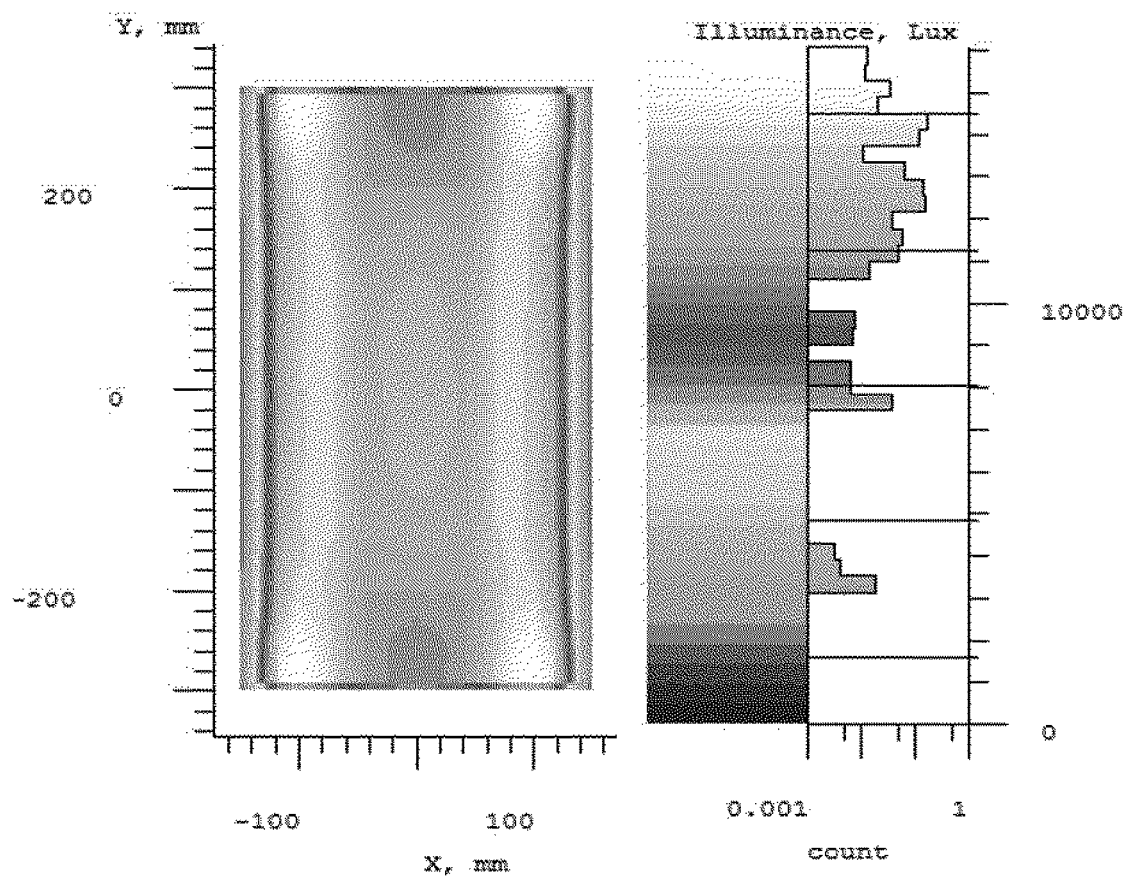
FIG. 15 is a view showing a luminous flux distribution of the lighting module shown in FIGS. 10 to 13.

FIG. 14 is a graph showing an optical characteristic of the lighting module according to the second embodiment shown in FIGS. 10 to 13. FIG. 15 is a view showing a luminous flux distribution of the lighting module according to the second embodiment shown in FIGS. 10 to 13.

Referring to FIGS. 14 and 15, it can be seen that uniformity, efficiency and a beam angle of the light emitted from the lighting module according to the second embodiment are about 87.3%, about 83.2% and about 115° respectively.

Meanwhile, through the described configuration, a size of the lighting module according to the second embodiment shown in FIGS. 10 to 13 may be reduced. Specifically, the size and height of the lighting module according to the second embodiment may be within 300×600 (mm) and 20 mm respectively.

FIGS. 20 to 27 below are views for specifically describing the light sources 500a, 500b, 500a' and 500b' shown in FIGS. 3 and 12.

Prior to the detailed descriptions of the light sources 500a, 500b, 500a' and 500b' shown in FIGS. 3 and 12, one example of a conventional light source will be described with reference to FIGS. 16 to 19.

Figure 16:
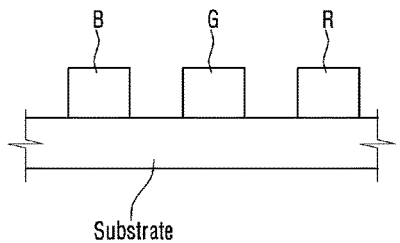
FIGS. 16 and 17 are cross sectional views showing schematically a conventional light source emitting white light.
Figure 17:
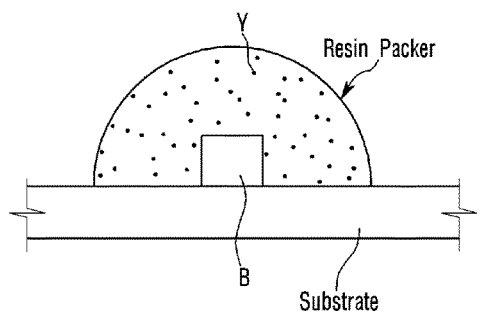

FIGS. 16 and 17 are cross sectional views showing schematically a conventional light source emitting white light.

The conventional light source shown in FIG. 16 includes a substrate and a blue (B) LED chip, a green (G) LED chip and a red (R) LED chip which are disposed on the substrate. The blue (B) LED chip, the green (G) LED chip and the red (R) LED chip emit blue light, green light and red light respectively. The three emitted lights are mixed with each other and become white light.

The conventional light source shown in FIG. 17 includes a substrate and a blue LED chip and a yellow (Y) fluorescent material which are disposed on the substrate. The yellow (Y) fluorescent material uses the blue LED chip as an excitation light source. The yellow (Y) fluorescent material is excited by blue light emitted from the blue LED chip and emits yellow light. The emitted yellow light and the blue light from the blue LED chip are mixed with each other and become white light.

As such, the conventional light sources shown in FIGS. 16 and 17 emit white light. Wavelength-based luminosities of the conventional light sources shown in FIGS. 16 and 17 will be described with reference to FIGS. 18 and 19.

Figure 18:
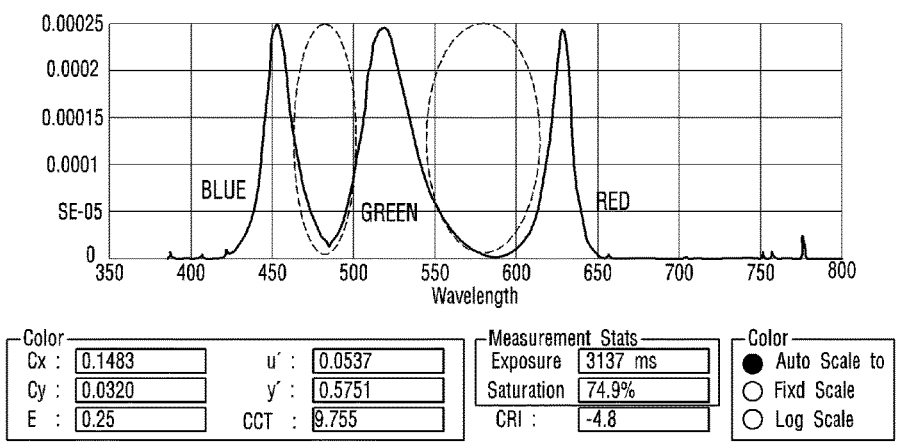
FIG. 18 is a graph showing a wavelength-based luminosity of the conventional light source shown in FIG. 16.

FIG. 18 is a graph showing a wavelength-based luminosity of the conventional light source shown in FIG. 16.

First, referring to FIGS. 16 and 18, it is possible to recognize a wavelength-based luminosity of the conventional light source including a blue (B) LED chip, a green (G) LED chip and a red (R) LED chip. As shown in FIG. 18, it can be found that the blue (B) LED chip has a maximum luminosity at a wavelength of about 450 nm to 460 nm, the green (G) LED chip has a maximum luminosity at a wavelength of about 510 nm to 530, and the red (R) LED chip has a maximum luminosity at a wavelength of about 625 nm to 635 nm.

A multichip solution which implements a light source emitting white light by using the R LED chip, the G LED chip and the B LED chip has the advantage of creating various colored lights in accordance with composition ratio of the R LED chip, the G LED chip and the B LED chip. However, as shown in FIG. 18, light with wavelengths denoted by a dotted-line is not emitted. Therefore, the light source emitting white light by using the R LED chip, the LED G chip and the B LED chip has insufficient spectrum at wavelengths of about 470 nm to 490 nm and 540 nm to 620 nm, and then has poor color rendering property.

Figure 19:
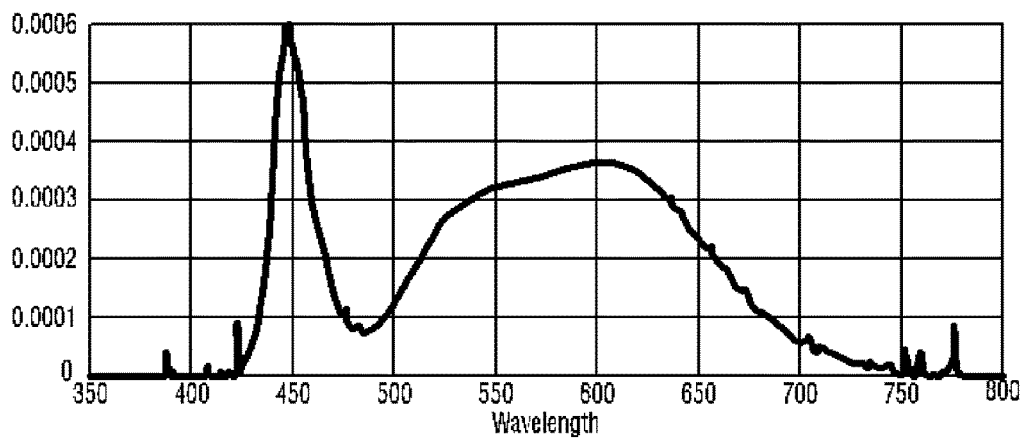
FIG. 19 is a graph showing a wavelength-based luminosity of the conventional light source shown in FIG. 17.

FIG. 19 is a graph showing a wavelength-based luminosity of the conventional light source shown in FIG. 17.

Referring to FIGS. 17 and 19, it is possible to recognize a wavelength-based luminosity of a white light emitting device including the blue (B) LED chip and the yellow (Y) fluorescent material. As shown in FIG. 19, the conventional light source including blue (B) LED chip and the yellow (Y) fluorescent material has high luminosity at a wavelength of 450 nm and has low luminosity at a wavelength of about 480 nm to 500 nm. Here, the conventional light source has considerable luminosity up to a wavelength of 500 nm to 680 nm. Accordingly, light with a wavelength greater than 500 nm has no problem to reproduce color rendering property.

A light emitting module or a lighting module which makes use of the conventional light sources shown in FIGS. 16 and 17 has, as described above, difficulty in forming a full spectrum having excellent color rendering property. A light source according to embodiments, which is able to overcome such problems, will be described below in detail.

Light Source According to the First Embodiment

Figure 20:
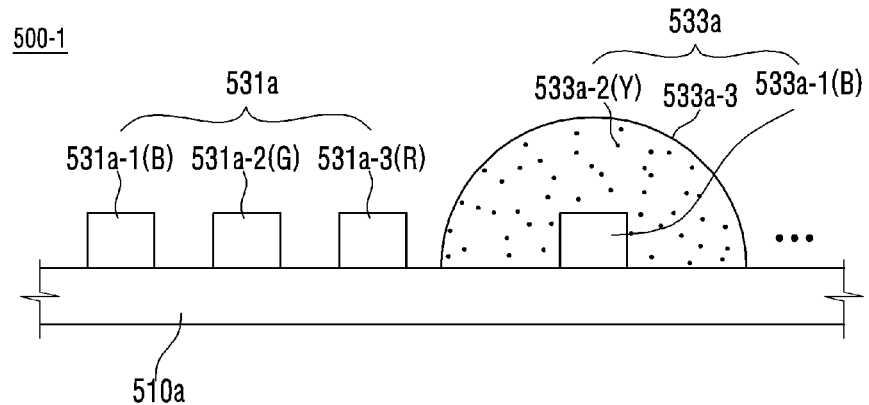
FIG. 20 is a cross sectional view showing schematically a light source 500-1 according to the first embodiment.

FIG. 20 is a cross sectional view showing schematically a light source 500-1 according to the first embodiment.

Referring to FIG. 20, the light source 500-1 according to the first embodiment comprises the substrate 510*a*, a first light emitter 531*a* and a second light emitter 533*a* which are disposed on the substrate 510*a*.

The first light emitter 531*a* comprises a blue (B) LED chip 531*a*-1, a green (G) LED chip 531*a*-2, and a red (R) LED chip 531*a*-3. The second light emitter 533*a* comprises a blue (B) LED chip 533*a*-1, a yellow (Y) fluorescent material 533*a*-2 and a resin packer 533*a*-3.

The resin packer 533*a*-3 may be formed to have a hemispherical shape functioning as a lens. For example, the resin packer 533*a*-3 may be formed of epoxy resin, silicone resin, hybrid resin or the like. Here, the resin packer 533*a*-3 may have not only the hemispherical shape but also an elliptical shape and a shape having a predetermined curved portion. As such, the LED chip is directly mounted on the substrate in the form of chip on board, so that the first and the second light emitters 531*a* and 533*a* may obtain greater orientation angle.

An electrode pattern or a circuit pattern (not shown) is formed on the substrate 510*a*. The circuit pattern may be connected to an electrode of the LED chip by means of, for example, wire bonding or flip-chip bonding and the like.

The light source 500-1 comprises a plurality of the light emitters 531*a* and 533*a*, and then forms a surface light source or a line light source which has a desired area. Therefore, the light source 500-1 can be used as a lighting device, a backlight unit or the like.

The first light emitter 531*a* uses the blue (B) LED chip 531*a*-1, the green (G) LED chip 531*a*-2 and the red (R) LED chip 531*a*-3. The first light emitter 531*a* is not formed by using a fluorescent material in the blue LED chip. This is because when the first light emitter 531*a* is formed by using the blue (B) LED chip 531*a*-1, the green (G) LED chip 531*a*-2 and the red (R) LED chip 531*a*-3, it is possible to achieve various color changes by controlling the brightness of each LED.

In the second light emitter 533*a*, the resin packer 533*a*-3 seals the blue (B) LED chip 533*a*-1. The resin packer 533*a*-3 comprises the yellow (Y) fluorescent material 533*a*-2. The blue light of the blue (B) LED chip 533*a*-1 is mixed with yellow light emitted from the yellow (Y) fluorescent material 533*a*-2, and then becomes white light. Here, the yellow (Y) fluorescent material 533*a*-2 may be formed of at least one particle-like material of a YAG fluorescent material, a TAG fluorescent material, an orthosilicate fluorescent material, a silicate fluorescent material, a nitride fluorescent material or an oxynitride fluorescent material.

The second light emitter 533*a* is able to form a full spectrum having excellent color rendering property. For this purpose, a peak wavelength of the blue (B) LED chip 533*a*-1 of the second light emitter 533*a* is changed into 470 nm to 490 nm from existing 450 nm. By doing this, it is possible to cover the spectrum at a wavelength of 470 nm to 490 nm of FIG. 19.

Light Source According to the Second Embodiment

Figure 21:
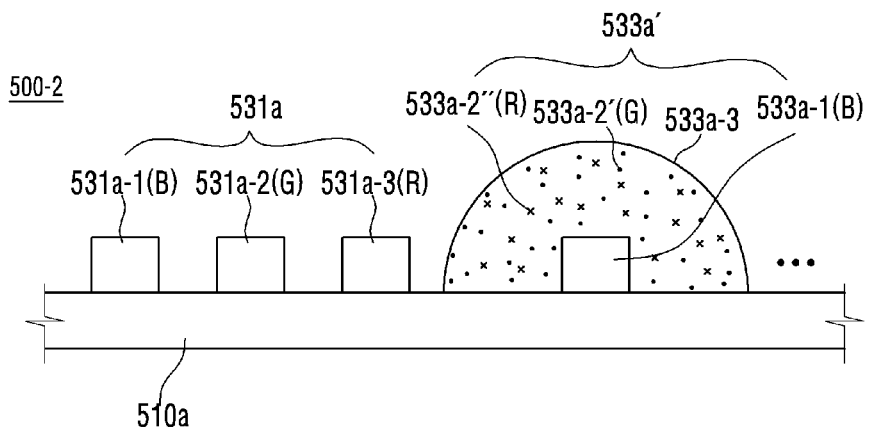
FIG. 21 is a cross sectional view showing schematically a light source 500-2 according to the second embodiment.

FIG. 21 is a cross sectional view showing schematically a light source 500-2 according to the second embodiment.

The kind of the fluorescent material comprised in the light source 500-2 according to the second embodiment shown in FIG. 21 is different from the kind of the fluorescent material comprised in the light source 500-1 according to the first embodiment shown in FIG. 20. Specifically, a second light emitter 533*a*' according to the second embodiment comprises a green (G) fluorescent material 533*a*-2' and a red (R) fluorescent material 533*a*-2".

The green (G) fluorescent material 533*a*-2' and the red (R) fluorescent material 533*a*-2" are excited by the blue (B) LED chip 533*a*-1 and emit green light and red light respectively. The green light and the red light are mixed with a part of blue light emitted from the blue (B) LED chip 533*a*-1, and then becomes white light. The green (G) fluorescent material 533*a*-2' may be a silicate fluorescent material (e.g., $(Ba,Sr)_2SiO_4$:Eu) including $A_2SiO_4$:Eu (A is any one selected from among Ba, Sr and Ca). Besides, $SrGa_2S_4$:Eu or β-SiAlON (Beta-SiAlON) may be used as the green (G) fluorescent material 533*a*-2'. The red (R) fluorescent material 533*a*-2" may be a nitride fluorescent material like $Ca_2Si_5N_8$:Eu, etc., or a sulfide fluorescent material like (Ca,Sr)S:Eu, etc., in order to obtain high color reproductivity.

The light sources 500-1 and 500-2 according to the first and the second embodiments are able to form a full spectrum without adding a cyan LED chip and to prevent color reproduction range from being reduced when a peak wavelength of the blue (B) LED chip 531*a*-1 of the first light emitter 531*a* is changed into 470 nm to 490 nm.

Light Source According to a Third Embodiment

Figure 22:
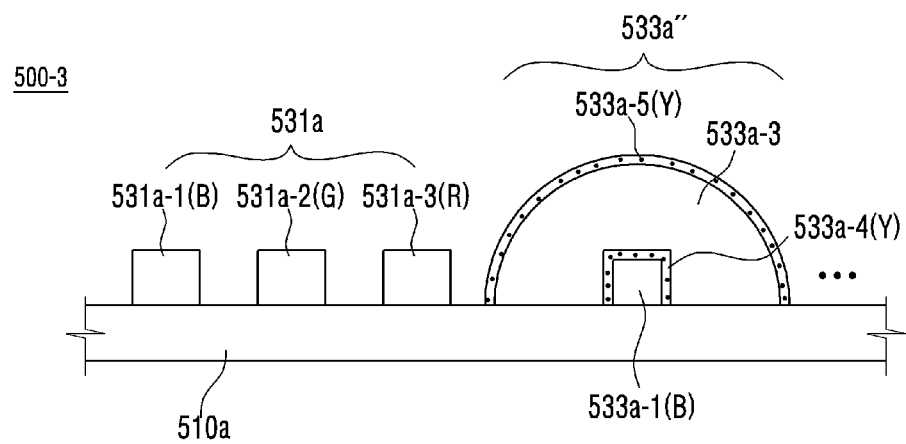
FIG. 22 is a cross sectional view showing schematically a light source 500-3 according to a third embodiment.

FIG. 22 is a cross sectional view showing schematically a light source 500-3 according to a third embodiment.

Referring to FIG. 22, the light source 500-3 according to the third embodiment comprises the substrate 510a, a first light emitter 531a and a second light emitter 533a" which are disposed on the substrate 510a. Here, the first light emitter 531a is the same as the first light emitter 531a shown in FIG. 20.

In the second light emitter 533a", a yellow (Y) fluorescent material film 533a-4 is coated on the blue (B) LED chip 533a-1, and then the hemispherical transparent resin packer 533a-3 is disposed on the blue (B) LED chip 533a-1. A yellow (Y) fluorescent material film 533a-5 including the yellow (Y) fluorescent material is coated on the transparent resin packer 533a-3.

A peak wavelength of the blue (B) LED chip 533a-1 of the second light emitter 533a" is from 470 nm to 490 nm. When the peak wavelength of the blue (B) LED chip 533a-1 is from 470 nm to 490 nm, it is possible to cover the wavelength of 470 nm to 490 nm of FIG. 19.

Light Source According to a Fourth Embodiment

Figure 23:
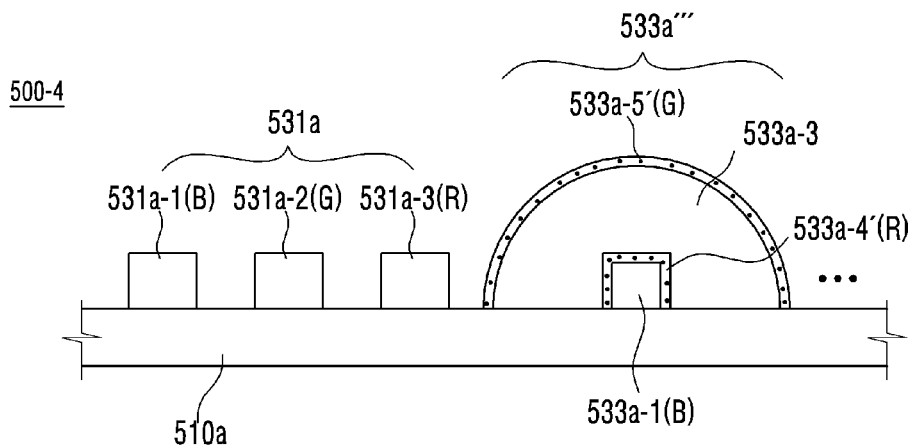
FIG. 23 is a cross sectional view showing schematically a light source 500-4 according to a fourth embodiment.

FIG. 23 is a cross sectional view showing schematically a light source 500-4 according to a fourth embodiment.

The kind of the fluorescent material comprised in the light source 500-4 according to the fourth embodiment shown in FIG. 23 is different from the kind of the fluorescent material comprised in the light source 500-3 according to the third embodiment shown in FIG. 22. Specifically, a second light emitter 533a''' according to the fourth embodiment comprises a red (R) fluorescent material film 533a-4' and a green (G) fluorescent material film 533a-5'.

Specifically, the red (R) fluorescent material film 533a-4' may be coated on the blue (B) LED chip 533a-1. The green (G) fluorescent material film 533a-5' may be coated on the resin packer 533a-3. Contrarily to this, the green (G) fluorescent material film may be coated on the blue (B) LED chip 533a-1. The red (R) fluorescent material film may be coated on the resin packer 533a-3.

The light source 500-4 according to the fourth embodiment comprises the red fluorescent material film 533a-4', the transparent resin packer 533a-3 and the green fluorescent material film 533a-5', thereby more improving the color uniformity of the emitted white light. If the green and the red fluorescent materials are simply dispersed within the resin packer 533a-3, it is expected that the fluorescent materials are not uniformly dispersed and layers of the fluorescent materials are formed and separated due to the difference in specific gravities of the fluorescent materials during a resin curing process. As a result, there is a possibility that the color uniformity is reduced. However, in the light source according to the fourth embodiment shown in FIG. 23, blue light emitted at various angles from the blue (B) LED chip 533a-1 is relatively uniformly absorbed or transmitted through the fluorescent material film 533a-4' and 533a-5', so that it is possible to obtain overall more uniform white light.

Also, as shown in FIG. 23, when the fluorescent material film 533a-4' and 533a-5' which are separated from each other by the transparent resin packer 533a-3 are used, it is possible to reduce optical loss caused by the fluorescent material. When the red and the green fluorescent materials are dispersed and mixed within the resin packer, it is expected that second light with a wavelength converted by the fluorescent material is scattered by particles of other fluorescent material located on an optical path, so that there is a possibility that optical loss occurs. However, in the light source according to the fourth embodiment shown in FIG. 23, the second light converted by the fluorescent material film 533a-4' transmits through the transparent resin packer 533a-3, and the second light converted by the fluorescent material film 533a-5' is emitted to the outside of the second light emitter 533a'''. Accordingly, it is possible to reduce optical loss caused by the particles of fluorescent material.

In the light sources according to the third and the fourth embodiments of FIGS. 22 and 23, the peak wavelengths of the blue (B) LED chips 533a-1 of the second light emitters 533a" and 533a''' are changed into 470 nm to 490 nm, so that it is possible to form a full spectrum having high color reproductivity.

Light Source According to a Fifth Embodiment

Figure 24:
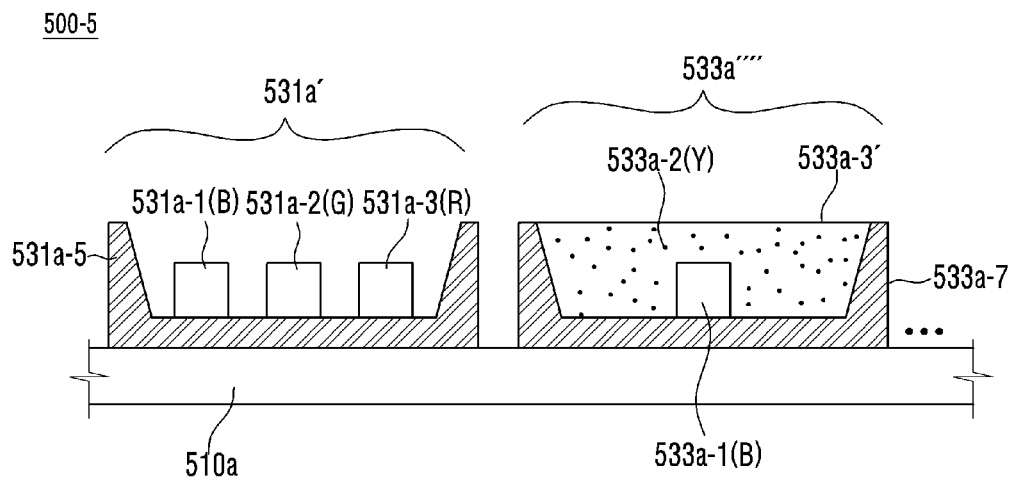
FIG. 24 is a cross sectional view showing schematically a light source 500-5 according to a fifth embodiment.

FIG. 24 is a cross sectional view showing schematically a light source 500-5 according to a fifth embodiment.

Referring to FIG. 24, the light source 500-5 according to the fifth embodiment comprises the substrate 510a, the first light emitter 531a' and a second light emitter 533a" which are disposed on the substrate 510a.

The first light emitter 531a' may comprise the blue (B) LED chip 531a-1, the green (G) LED chip 531a-2, the red (R) LED chip 531a-3 and a body 531a-5. The body 531a-5 has a predetermined cavity. The blue (B) LED chip 531a-1, the green (G) LED chip 531a-2 and the red (R) LED chip 531a-3 are disposed within the cavity.

The second light emitter 533a''' may comprise the blue (B) LED chip 533a-1, the yellow (Y) fluorescent material 533a-2, a resin packer 533a-3' and a body 533a-7. The body 533a-7 has a predetermined cavity. The blue (B) LED chip 533a-1, the yellow (Y) fluorescent material 533a-2, the resin packer 533a-3' are disposed within the cavity. The yellow (Y) fluorescent material 533a-2 is mixed within the resin packer 533a-3'. The blue (B) LED chip 533a-1 is buried within the resin packer 533a-3'.

Light Source According to a Sixth Embodiment

Figure 25:
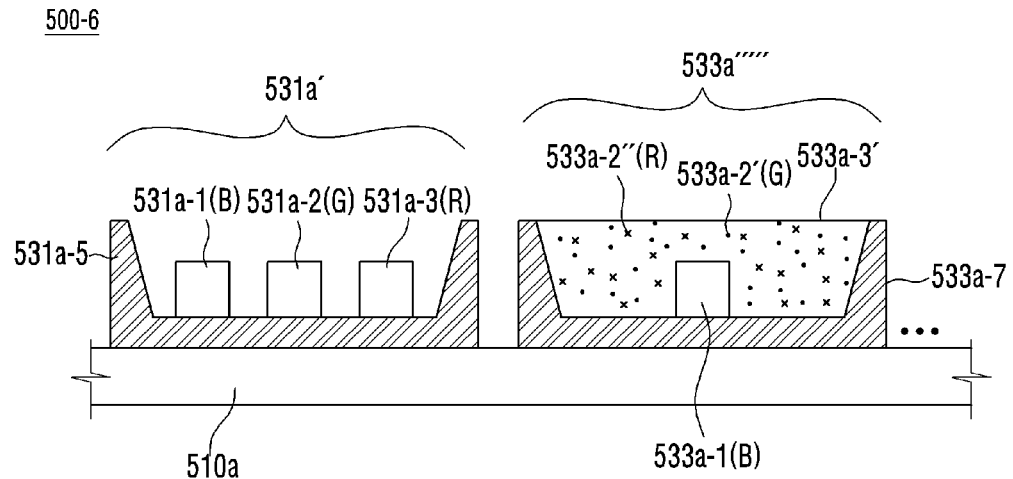
FIG. 25 is a cross sectional view showing schematically a light source 500-6 according to a sixth embodiment.

FIG. 25 is a cross sectional view showing schematically a light source 500-6 according to a sixth embodiment.

The kind of the fluorescent material comprised in the light source 500-6 according to the sixth embodiment shown in FIG. 25 is different from the kind of the fluorescent material comprised in the light source 500-5 according to the fifth embodiment shown in FIG. 24. Specifically, a second light emitter 533a'''' according to the sixth embodiment comprises the green (G) fluorescent material 533a-2' and the red (R) fluorescent material 533a-2".

The light sources 500-5 and 500-6 according to the fifth and the sixth embodiments are able to form a full spectrum without adding a cyan LED chip and to prevent color reproduction range from being reduced when a peak wavelength of the blue (B) LED chip 531a-1 of the first light emitter 531a' is changed into 470 nm to 490 nm.

Light Source According to a Seventh Embodiment

Figure 26:
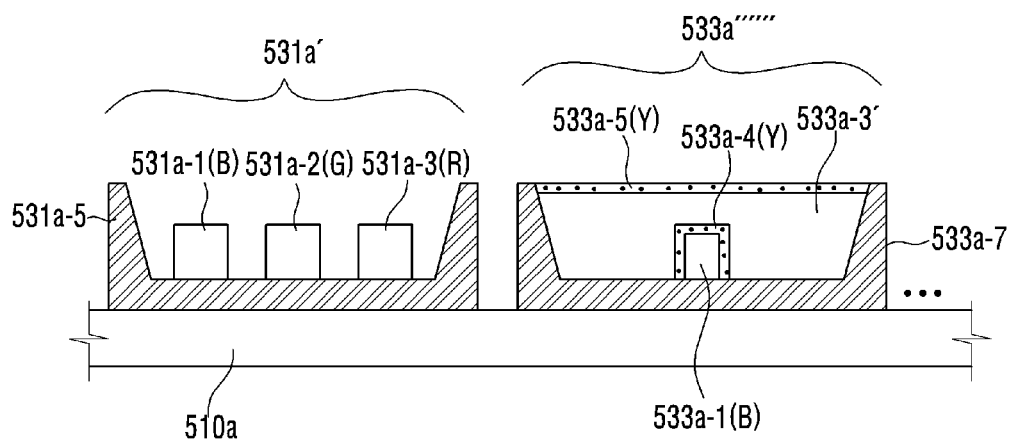
FIG. 26 is a cross sectional view showing schematically a light source 500-7 according to a seventh embodiment.

FIG. 26 is a cross sectional view showing schematically a light source 500-7 according to a seventh embodiment.

Referring to FIG. 26, the light source 500-7 according to the seventh embodiment comprises the substrate 510a, a first light emitter 531a' and a second light emitter 533a''''' which are disposed on the substrate 510a. Here, the first light emitter 531a' is the same as the first light emitter 531a' shown in FIG. 25.

In the second light emitter 533a''''', the yellow (Y) fluorescent material film 533a-4 is coated on the blue (B) LED chip 533a-1, and then the hemispherical transparent resin packer 533a-3' is disposed on the blue (B) LED chip 533a-1. The yellow (Y) fluorescent material film 533a-5 including the yellow (Y) fluorescent material is coated on the transparent resin packer 533a-3'.

A peak wavelength of the blue (B) LED chip 533a-1 of the second light emitter 533a''''' is from 470 nm to 490 nm. When the peak wavelength of the blue (B) LED chip 533a-1 is from 470 nm to 490 nm, it is possible to cover the wavelength of 470 nm to 490 nm of FIG. 19.

Light Source According to an Eighth Embodiment

Figure 27:
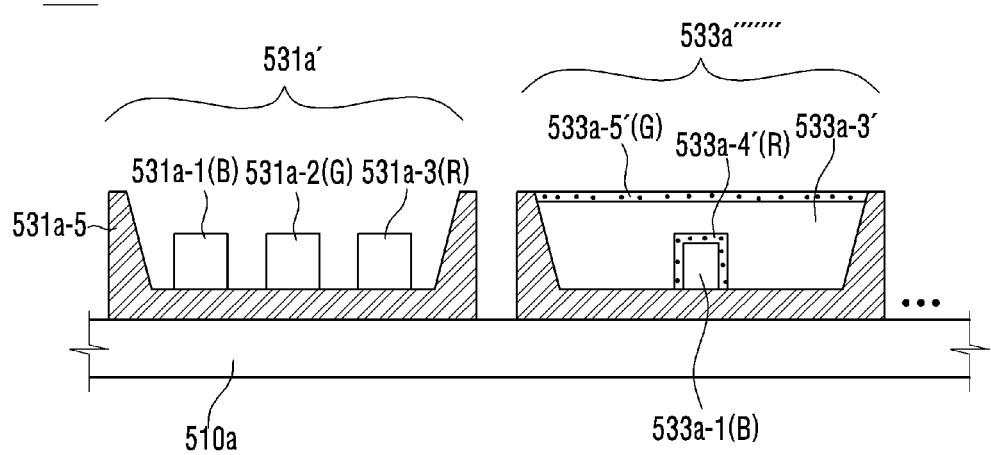
FIG. 27 is a cross sectional view showing schematically a light source 500-8 according to an eighth embodiment.

FIG. 27 is a cross sectional view showing schematically a light source 500-8 according to an eighth embodiment.

The kind of the fluorescent material comprised in the light source 500-8 according to the eighth embodiment shown in FIG. 27 is different from the kind of the fluorescent material comprised in the light source 500-7 according to the seventh embodiment shown in FIG. 26. Specifically, a second light emitter 533a''''' according to the eighth embodiment comprises the red (R) fluorescent material film 533a-4' and the green (G) fluorescent material film 533a-5'.

Specifically, the red (R) fluorescent material film 533a-4' may be coated on the blue (B) LED chip 533a-1. The green (G) fluorescent material film 533a-5' may be coated on the resin packer 533a-3. Contrarily to this, the green (G) fluorescent material film may be coated on the blue (B) LED chip 533a-1. The red (R) fluorescent material film may be coated on the resin packer 533a-3.

The light source 500-8 according to the eighth embodiment comprises the red fluorescent material film 533a-4', the transparent resin packer 533a-3' and the green fluorescent material film 533a-5', thereby more improving the color uniformity of the emitted white light. Specifically, in the light source according to the eighth embodiment shown in FIG. 27, blue light emitted at various angles from the blue (B) LED chip 533a-1 is relatively uniformly absorbed or transmitted through the fluorescent material film 533a-4' and 533a-5', so that it is possible to obtain overall more uniform white light.

Also, when the fluorescent material film 533a-4' and 533a-5' which are separated from each other by the transparent resin packer 533a-3' are used, it is possible to reduce optical loss caused by the fluorescent material. More specifically, in the light source according to the eighth embodiment shown in FIG. 27, the second light converted by the fluorescent material film 533a-4' transmits through the transparent resin packer 533a-3', and the second light converted by the fluorescent material film 533a-5' is emitted to the outside of the second light emitter 533a'''''. Accordingly, it is possible to reduce optical loss caused by the particles of fluorescent material.

Although preferred embodiments of the present invention were described above, these are just examples and do not limit the present invention. Further, the present invention may be changed and modified in various ways, without departing from the essential features of the present invention, by those skilled in the art. For example, the components described in detail in the embodiments of the present invention may be modified. Further, differences due to the modification and application should be construed as being included in the scope and spirit of the present invention, which is described in the accompanying claims.

The invention claimed is:

1. A lighting module comprising:
   an optical plate;
   a base frame comprising a central frame provided on the optical plate, a first frame coupled to the central frame, and a second frame coupled to the first frame;
   a side frame separate from the optical plate and the base frame and coupled to the optical plate and the second frame of the base frame; and
   a light source having a substrate provided on the side frame and a light emitter provided on the substrate,
   wherein the second frame is provided on the light source, and wherein the second frame includes an inner surface reflecting light from the light source to at least one of the first frame and the central frame,
   wherein the side frame comprises a coupler which is coupled to one side of the optical plate,
   wherein the coupler is configured to receive the one side of the optical plate,
   wherein the side frame has a recess to receive the substrate,
   wherein the side frame comprises a first side frame which is coupled to the second frame and a second side frame on which the substrate and the coupler are provided,
   wherein the second frame of the base frame comprises a first end coupled to the first side frame of the side frame, and a second end coupled to the first frame of the base frame,
   wherein the first frame of the base frame includes a first end coupled to the second frame of the base frame, and a second end coupled to the central frame of the base frame,
   wherein, a thickness of the first end of the second frame of the base frame is greater than a thickness of the first end of the first frame of the base frame,
   wherein a thickness of the central frame of the base frame is greater than a thickness of the second end of the first frame of the base frame,
   wherein the light emitter of the light source comprises a first light emitter and a second light emitter,
   wherein the first light emitter comprises a first blue LED chip, a green LED chip, and a red LED chip,
   wherein the second light emitter comprises a second blue LED chip and a fluorescent material, the fluorescent material comprising at least one of a yellow fluorescent material, a green fluorescent material and a red fluorescent material, and
   wherein a peak wavelength of the second blue LED chip is different than a peak wavelength of the first blue LED chip.

2. The lighting module of claim 1, wherein a cross sectional shape of the inner surface of the second frame is at least one of a parabolic shape, a hyperbolic shape and an elliptical shape.

3. The lighting module of claim 1, wherein a thickness of the first end of the second frame is greater than a thickness of the second end of the second frame.

4. The lighting module of claim 3, wherein the central frame comprises a side surface coupled to the first frame, and wherein a thickness of the side surface is greater than a thickness of the second end of the second frame and is less than a thickness of the first end of the second frame.

5. The lighting module of claim 4, wherein a thickness of the first end of the first frame is less than a thickness of the second end of the first frame.

6. A lighting module comprising:
   an optical plate;
   a base frame comprising a central frame provided on the optical plate, a first frame coupled to the central frame, and a second frame coupled to the first frame;
   a side frame separate from the optical plate d the base frame and coupled to the optical plate and the second frame of the base frame; and
   a light source comprising a substrate provided on the side frame and alight emitter provided on the substrate,
   wherein the second frame is provided on the light source, and wherein the second frame comprises an inner surface reflecting light from the light source to at least one of the first frame and the central frame,
wherein the light emitter of the light source comprises:
a first light emitter provided on the substrate; and
a second light emitter provided on the substrate and around the first light emitter,
wherein the second frame of the base frame comprises a first end which is coupled to the side frame and a second end which is coupled to the first frame,
wherein a thickness of the first end of the second frame is greater than a thickness of the second end of the second frame,
wherein the inner surface of the second frame is curved and provided between the first end of the second frame and the second end of the second frame,
wherein the side frame comprises a first surface which is coupled to the first side end of the second frame and a second surface on which the substrate is provided, the second surface being perpendicular to the first surface,
wherein the first light emitter comprises a first blue LED chip, a green LED chip, and a red LED chip,
wherein the second light emitter comprises a second blue LED chip and a fluorescent material, the fluorescent material comprising at least one of a yellow fluorescent material, a green fluorescent material and a red fluorescent material, and
wherein a peak wavelength of the second blue LED chip is different than a peak wavelength of the first blue LED chip.

7. The lighting module of claim 6, wherein the second light emitter comprises:
a first fluorescent material, film which is provided on the second blue LED chip and comprises the yellow fluorescent material;
a resin packer which is provided on the first fluorescent material film; and
a second fluorescent material film which is provided on the resin packer and comprises the yellow fluorescent material.

8. The lighting module of claim 6, wherein the first light emitter further comprises a first body in which the red LED chip, the green LED chip and the first blue LED chip are provided, and wherein the second light emitter further comprises a second body in which the second blue LED chip and the yellow fluorescent material are provided.

9. The lighting module of claim 6, wherein the second light emitter comprises:
a first fluorescent material film which is provided on the second blue LED chip and comprises any one of the red fluorescent material and the green fluorescent material;
a resin packer which is provided on the first fluorescent material film; and
a second fluorescent material film which is provided on the resin packer and comprises any one of the red fluorescent material and the green fluorescent material.

10. The lighting module of claim 6, wherein the first light emitter further comprises a first body in which the red LED chip, the green LED chip and the first blue LED chip are provided, and wherein the second light emitter further includes a second body in which the second blue LED chip and any one of the red fluorescent material and the green fluorescent material are provided.

11. The lighting module of claim 6, wherein the inner surface of the second frame have at least one of a parabolic shape, a hyperbolic shape and an elliptical shape, and wherein the light emitter is located at a focus of at least one of the parabolic shape, the hyperbolic shape and the elliptical shape.

12. The lighting module of claim 6, wherein at least a portion of the light emitted from the lighting module is uniform.

13. A lighting module comprising:
an optical plate;
a base frame having a central frame provided on the optical plate, a first frame coupled to the central frame, and a second frame coupled to the first frame;
a side frame separate from the optical plate and the base frame and coupled to the optical plate and the second frame of the base frame; and
a light source having a substrate provided on the side frame in such a manner as to be perpendicular to the optical plate, and a light emitter provided on the substrate,
wherein a thickness of the first frame of the base frame is uniform, and wherein a thickness of the central frame is larger than that of the first frame,
wherein the side frame comprises a coupler which is coupled to one side of the optical plate,
wherein the couplet is configured to receive the one side of the optical plate,
wherein the second frame of the base frame comprises a first side surface which is coupled to the side frame and a second side surface which is coupled to the first frame,
wherein a thickness of the first side surface is greater than a thickness of the second side surface,
wherein an inner surface of the first frame has predetermined roughnesses,
wherein the central frame of the base frame includes a first side surface, a second side surface and an inner surface provided between the first side surface and the second side surface, and
wherein a cross section of the inner surface of the central frame has a hemispherical shape or a semi-elliptical shape.

14. The lighting module of claim 13, wherein the side frame comprises:
a first side frame on which the substrate of the light source is provided and is coupled to the first side surface of the second frame of the base frame; and
a second side frame which is coupled between the first side frame and the optical plate.

15. The lighting module of claim 14, wherein the second frame of the base frame has a recess receiving one side of the substrate of the light source, and wherein the second side frame of the side frame has a recess receiving the other side of the substrate of the light source.

16. The lighting module of claim 13, wherein a length of the central frame is less than a length of the first frame.

17. The lighting module of claim 13, wherein the light source comprises a first light emitter and a second tight emitter provided on the substrate,
wherein the first light emitter comprises a first blue LED chip, a green LED chip, and a red LED chip,
wherein the second light emitter comprises a second blue LED chip and a fluorescent material, the fluorescent material comprises at least one of a yellow fluorescent material, a green fluorescent material and a red fluorescent material,
wherein a peak wavelength of the second blue LED chip is different than a peak wavelength of the first blue LED chip.

18. The lighting module of claim 13, wherein a distance from an inner surface of the central frame to the optical plate is less than a distance from at least one of the first frame and the second frame to the optical plate.

19. The lighting module of claim 13, wherein a thickness of the first side surface is less than a maximum thickness of the central frame.

* * * * *